United States Patent

Lu et al.

[11] Patent Number: 6,133,114
[45] Date of Patent: Oct. 17, 2000

[54] METHOD FOR FABRICATING A SHALLOW TRENCH ISOLATION

[75] Inventors: William Lu, Tai-Ping; Tsung-Yuan Hung, Tainan, both of Taiwan

[73] Assignee: United Semiconductor Corp., Hsinchu, Taiwan

[21] Appl. No.: 09/152,450

[22] Filed: Sep. 14, 1998

[30] Foreign Application Priority Data

Jun. 22, 1998 [TW] Taiwan .................................. 87109987

[51] Int. Cl.$^7$ .................................................. H01L 21/76
[52] U.S. Cl. .......................... 438/424; 438/221; 438/359
[58] Field of Search .................................... 438/221, 424, 438/359, 427

[56] References Cited

U.S. PATENT DOCUMENTS

| | | | |
|---|---|---|---|
| 5,728,621 | 3/1998 | Zheng et al. | 438/427 |
| 5,817,567 | 10/1998 | Jang | 438/424 |
| 5,918,131 | 6/1999 | Hsu et al. | 434/424 |
| 5,998,278 | 12/1999 | Yu | 438/424 |
| 6,017,803 | 1/2000 | Wong | 438/424 |

*Primary Examiner*—Charles Bowers
*Assistant Examiner*—David S Blum
*Attorney, Agent, or Firm*—Thomas, Kayden, Horstemeyer & Risley

[57] ABSTRACT

A method for fabricating a STI structure includes a pad oxide layer and a hard masking layer are sequentially formed over a semiconductor substrate. A trench is formed in the substrate by patterning over the substrate. A liner oxide layer is formed over a side-wall of the trench in the substrate. An isolating layer by APCVD and an isolating layer by HDPCVD are sequentially formed over the substrate, in which the height of the CVD isolating layer within the trench is lower than the height of the hard masking layer. A CMP process is performed, using the hard masking layer as a polishing stop. The hard masking layer and the pad oxide layer are removed to accomplish the STI structure.

10 Claims, 3 Drawing Sheets

METHOD FOR FABRICATING A SHALLOW TRENCH ISOLATION

CROSS-REFERENCE TO RELATED APPLICATION

This application claims the priority benefit of Taiwan application Ser. No. 87109987, filed Jun. 22, 1998, the full disclosure of which is incorporated herein by reference.

BACKGROUND OF THE INVENTION

1. Field of the Invention

This invention relates to semiconductor fabrication, and more particularly to a method for fabricating a STI structure to prevent microscratch from occurring on the STI structure during a chemical mechanical polishing (CMP) process.

2. Description of Related Art

The purpose of an isolation structure in an IC device is to prevent carriers, such as electrons or electron-holes, from drifting between two adjacent device elements through a semiconductor substrate to cause a current leakage. For example, carriers drift between two adjacent transistors through their substrate. Conventionally, isolation structures are formed between field effect transistors (FETs) in an IC device, such as a dynamic random access memory (DRAM) device, to prevent a current leakage from occurring. A shallow trench isolation (STI) structure is one of the isolation structures being widely used.

FIGS. 1A–1D are cross-sectional views of a semiconductor device schematically illustrating a conventional fabrication process for forming a shallow trench isolation structure. In FIG. 1A, a pad oxide layer 102 and a silicon nitride layer 104 are sequentially formed over a semiconductor substrate 100. In FIG. 1B, a trench 106 is formed in the substrate 100 by patterning over the substrate 100 through, for example, photolithography and etching. The silicon nitride layer 104 and the pad oxide layer 102 are etched through and become a silicon nitride layer 104a and a pad oxide layer 102a. Then, a liner oxide layer 108 is formed over the side-wall of the trench 106.

In FIG. 1C and FIG. 1D, an oxide layer 110 is formed over the substrate 100 so that the trench 106 shown in FIG. 1B is filled with oxide. A CMP process is, for example, performed to polish the oxide layer 110, in which the silicon nitride layer 104a is used as a polishing stop so that it is exposed. Then, the silicon nitride layer 104a is removed by, for example, wet etching. A residual of the oxide layer 110 fills the trench 106 becoming a STI oxide 110a. The STI oxide 110a and the liner oxide layer 108 form a STI structure.

The CMP process is one of planarization technologies by making use of slurry, which is a chemical reagent, to chemically and mechanically polish the uneven surface of a deposited oxide layer so as to achieve a planarization purpose. Slurry contains a huge number of fine grinding particles with a dimension of about 0.1–0.2 microns. The grinding particles compose a good abrasive. A rotating holder holds the wafer on the backside. The front surface is pushed onto a polishing pad, which is held by a rotating polishing table. Slurry is provided on the contact surface between the polishing pad and the front surface of the wafer. Since they are rotated, the polishing purpose is achieved. The ingredient of slurry is different for a different material to be polished.

During the CMP process, the fine grinding particles may cause a microscratch on a soft material. For example, in a method for fabricating a STI structure as described above, the oxide layer 110 is usually formed by atmospheric pressure (AP) chemical vapor deposition (CVD) (APCVD). In FIG. 1C, the oxide layer 110 is thereby soft. As the CMP process is performed to form the STI oxide 110a, in order to totally remove the oxide layer 110 above the silicon nitride layer 104a, the silicon nitride layer 104a is strategically over-polished. Since the hardness of silicon nitride is higher than oxide, oxide is polished away with a higher rate to cause a dishing top surface of the STI oxide 110a. The dishing phenomenon affects the performance of the device.

Moreover, during the over-polishing stage, the CMP process polishes silicon nitride to produce silicon nitride particles, which are mixed with slurry and cause a damage on the STI oxide 110a, such as a microscratch 112. Even though the microscratch phenomenon is not observable by eye, if it is not fixed, it may cause an occurrence of a bridge between polysilicon gates formed subsequently or an occurrence of a mispattern, in which the bridge may induce current leakage. The microscratch phenomenon then results in a failure of device.

One solution to this problem may be to substitute a high-density plasma (HDP) CVD (HDPCVD) for APCVD. Since HDPCVD can produce a denser oxide layer, the APCVD process may be replaced by the HDPCVD. In this manner, even though the oxide layer 110 with the denser property can resist the microscratch phenomenon due to a mix of slurry and silicon nitride particles, the high-density plasma may damage over the substrate 100. As a gate oxide layer is subsequently formed, the damage may cause a failure of a QBD test on the gate oxide layer, in which the QBD test is a charge breakdown test for an insulating material. Hence, using HDPCVD to form the oxide layer 110 is not suitable either.

SUMMARY OF THE INVENTION

It is therefore an objective of the present invention to provide a method for fabricating a STI structure with a prevention of microscratch resulting from performing a CMP process on it.

It is another an objective of the present invention to provide a method for fabricating a STI structure, while preventing damage that may result from from HDPCVD.

It is still another an objective of the present invention to provide a method for fabricating a STI structure that avoids a dishing phenomenon often due to an over-polishing process.

In accordance with the foregoing and other objectives of the present invention, a method is provided for fabricating a STI structure having a pad oxide layer and a hard masking layer that are sequentially formed over a semiconductor substrate. In accordance with the method, a trench is formed in the substrate by patterning over the substrate. A liner oxide layer is formed over a side-wall of the trench in the substrate. An isolating layer formed by CVD and an second isolating layer formed by HDPCVD are sequentially over the substrate, in which the height of the first isolating layer within the trench is lower than the height of the hard masking layer. The second isolating layer is formed to be at least about as hard as the hard masking layer or harder. In this way, the hard masking layer and the second isolating layer are polished at substantially the same rate. Likewise, the second isolating layer has a smaller polished rate than that of the hard masking layer when the second isolating layer is harder. Then, a CMP process is performed to polish and planarize over the substrate so that the hard masking layer is exposed. The trench thereby includes a residual first isolating layer on the lower part and a residual second isolating layer on the upper part, which can prevent the microscratch and dishing phenomena from occurring. During forming the second isolating layer through HDPCVD, the first isolating layer advantageously also protects the substrate from high density plasma damaging.

The hard masking layer and the pad oxide layer are then removed by, for example, etching to accomplish a STI structure.

BRIEF DESCRIPTION OF DRAWINGS

The invention can be more fully understood by reading the following detailed description of the preferred embodiment with reference made to the accompanying drawings as follows.

DETAILED DESCRIPTION OF PREFERRED EMBODIMENT

In order to prevent the microscratch and dishing phenomena from occurring on a STI structure and protect over the substrate from damaging during a HDPCVD process that forms an insulating layer, an improved method for fabricating a STI structure is provided. The method includes forming two insulating layers over the substrate through a CVD process and a HDPCVD process, respectively. Hence, the HDPCVD insulating layer with increased hardness can prevent the microscratch and dishing phenomena that occur on a conventional STI structure. The CVD insulating layer can protect over the substrate from the HDPCVD process.

Figure 1A:
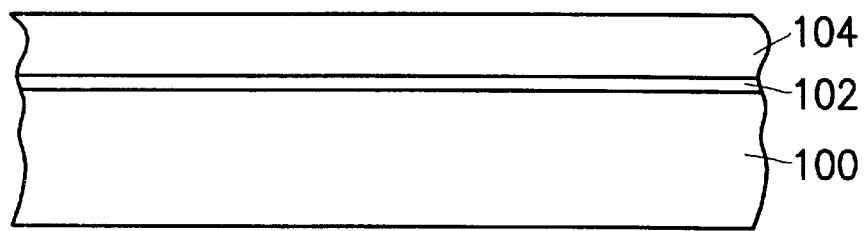
FIGS. 1A–1D are cross-sectional views of a semiconductor device schematically illustrating a conventional fabrication process for forming a shallow trench isolation structure.
Figure 1B:
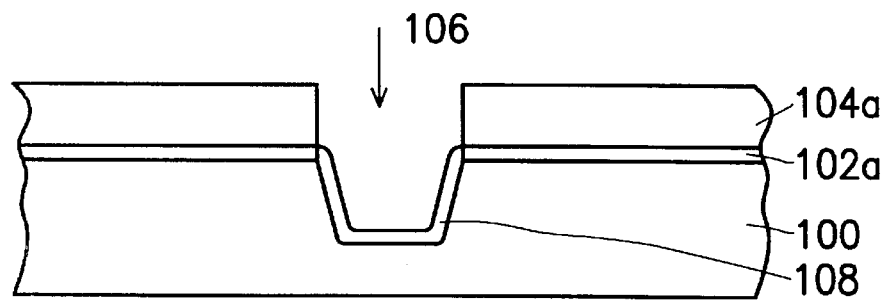
Figure 1C:
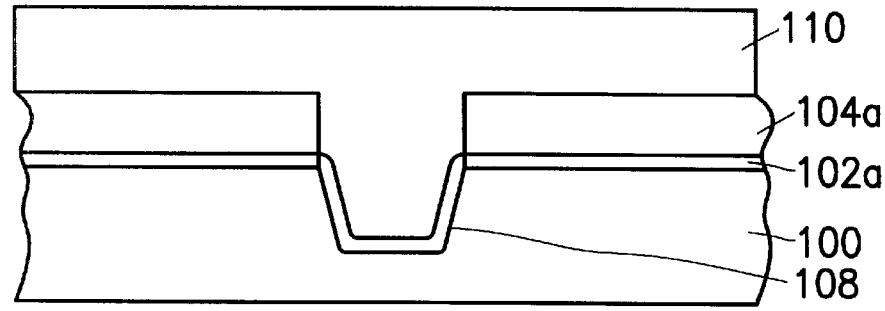
Figure 1D:
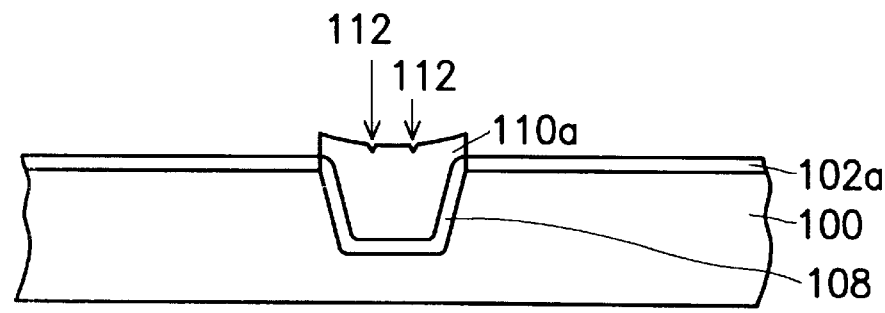
Figure 2A:
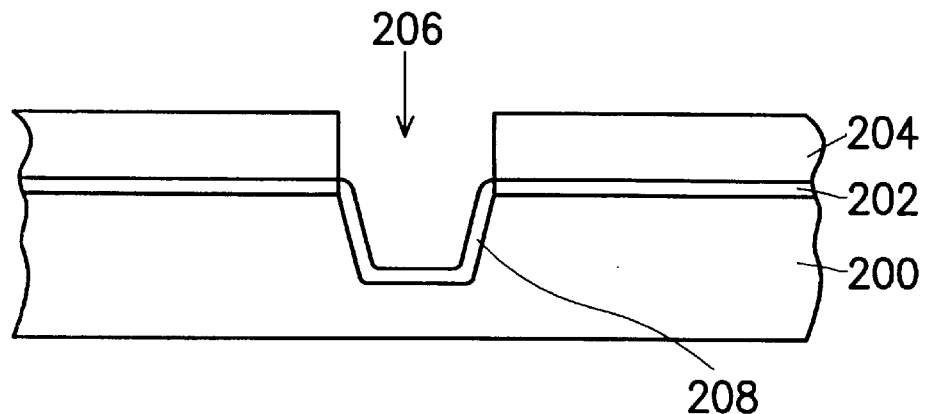
FIGS. 2A–2E are cross-sectional views of a semiconductor device schematically illustrating a fabrication process for forming a shallow trench isolation structure, according to a preferred embodiment.

FIGS. 2A–2E are cross-sectional views of a semiconductor device schematically illustrating a fabrication process for forming a shallow trench isolation structure, according to a preferred embodiment. In FIG. 2A, a pad oxide layer 202 and a hard masking layer 204 are sequentially formed over a semiconductor substrate 200. A trench 206 is formed in the substrate 200 by, for example, photolithography and etching, in which the hard masking layer 204 and the pad oxide layer are etched through. After etching, the hard masking layer 204 covers a region over the substrate, which is called active area. The hard masking layer 204 includes, for example, silicon nitride. Next, a liner oxide layer 208 is formed over the side-wall of the trench 206 in the substrate 200 through a thermal oxidation process.

Figure 2B:
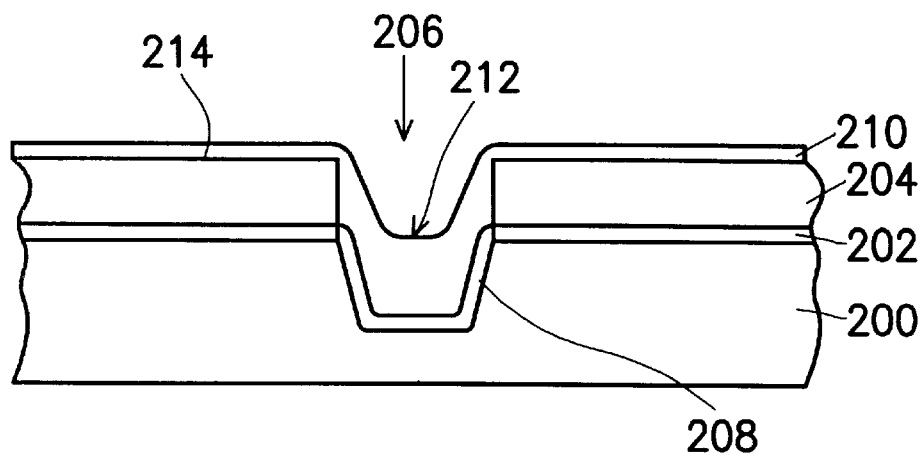

In FIG. 2B, an insulating layer 210 is formed over the substrate 200 by, for example, depositing oxide through APCVD and densifying it. As will be appreciated by one skilled in the art, the oxide may be densified by, for example, heating. The insulating layer 210 is softer than the hard masking layer 204. The insulating layer 210 within the trench 206 has a trench oxide surface 212, which is lower than a hard masking layer surface 214.

Figure 2C:
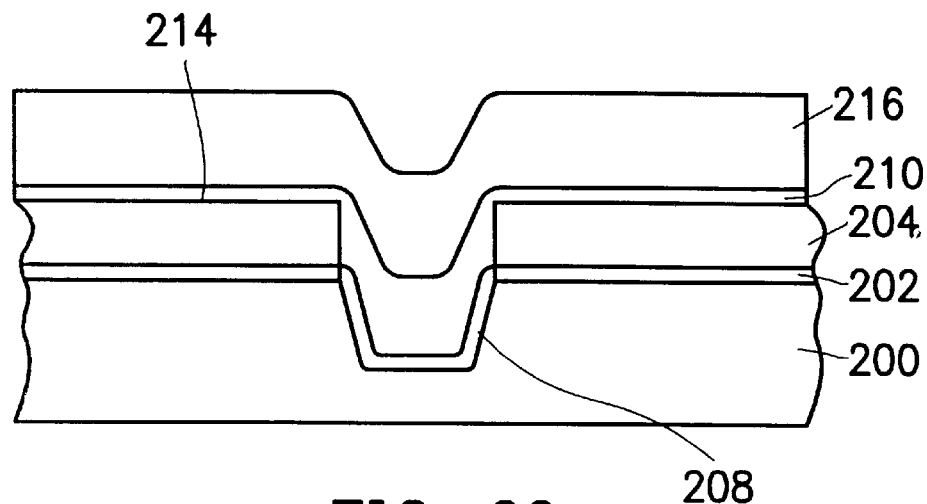

In FIG. 2C, an insulating layer 216 is formed over the substrate 200 by, for example, depositing oxide through HDPCVD. The insulating layer 216 is at least about as hard as the hard masking layer 204 or harder. Indeed, the HDPCVD process naturally forms a hard oxide layer. During formation of the insulating layer 216, the lower insulating layer 210 can protect over the substrate 200 from damaging due to the HDP. For example, the insulating layer 216 can prevent HDP ions from entering into the substrate 200. If this damage occurs, a gate oxide layer (not shown) formed subsequently may has bad quality to cause a failure of a QBD test for the quality control, in which the QBD test is a charge breakdown test on an insulating material. This is one advantage of the invention.

Figure 2D:
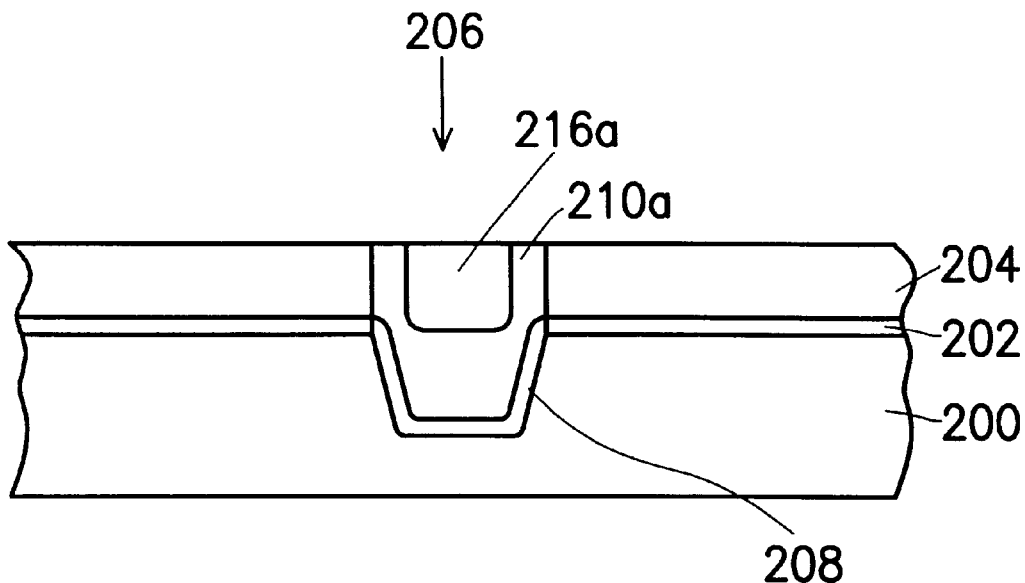

In FIG. 2D, a CMP process is performed over the substrate 200, using the hard masking layer 204 as a polishing stop. A portion of the insulating layers 210, 216 other than the trench 206 is removed to expose the hard masking layer 204. The insulating layers 210, 216 within the trench 206 become an insulating layer 210a and an insulating layer 216a, and are simultaneously planarized to have the same height as the surface of the hard masking layer 214 shown in FIG. 2C. The microscratch and dishing phenomena do not occur on the insulating layer 216a. The reason is following.

Since the insulating layer 216a is formed by HDPCVD, which is at least about as hard as the hard masking layer, it can avoid a microscratch phenomenon that otherwise occurs due to a mix of slurry and silicon nitride particles during the CMP process. Moreover, the dishing phenomenon is avoided because the polishing rate on the insulating layer 216a is not smaller than that on the hard masking layer 204. This is another characteristic of the invention.

Figure 2E:
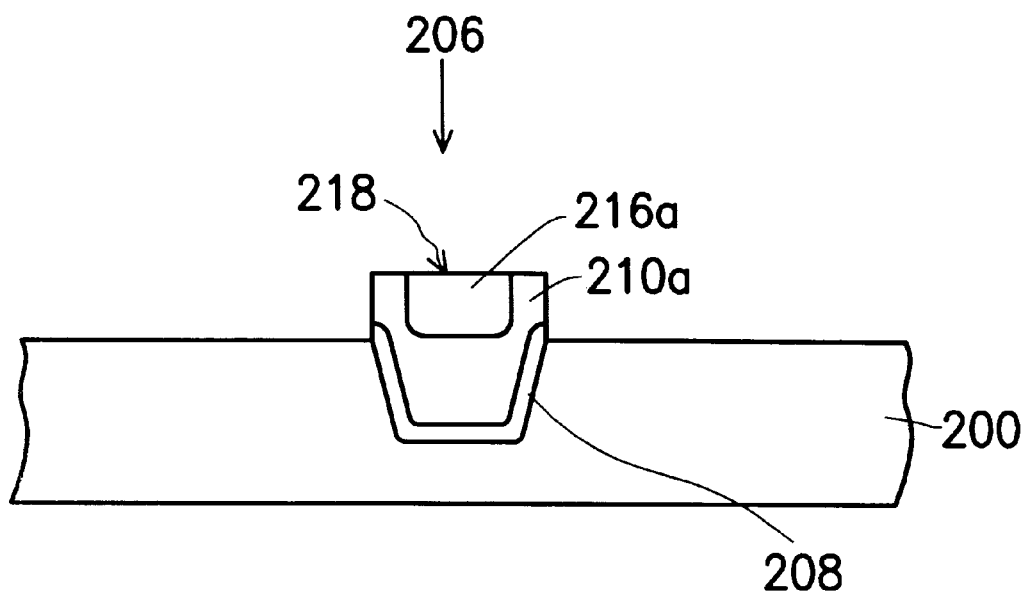

In FIG. 2E, the hard masking layer 204 and the pad oxide layer 202 are removed by, for example, dipping the substrate 200 into a HF acid solution, resulting in an improved STI structure. The STI structure includes the liner oxide layer 208, the insulating layer 210a at the lower part and the insulating layer 216a at the upper part. As will be appreciated by one skilled in the art, the liner oxide layer 208 may preferably be formed for a purpose to provide a better adhesion for the material to be subsequently formed over.

In conclusion, the invention is characterized by following:

The method includes forming two insulating layers 210, 216 over the substrate 200 through an APCVD process and a HDPCVD process, respectively. The top surface of the insulating layer 210 within the trench 206 is lower than the top surface of the hard masking layer 204. This ensures that the overlying insulating layer 216 protects the surface of the insulating layer 210, within the trench 206, from microscratch and dishing during a CMP process, since the HDPCVD insulating layer 216 has greater hardness. Further, the APCVD insulating layer 210 can protect over the substrate 200 from damaging of HDP in the HDPCVD process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a shallow trench isolation (STI) structure on a semiconductor substrate, having a pad oxide layer and a masking layer sequentially formed over the substrate, and having a trench formed in the substrate through the pad oxide layer and the masking layer, the method comprising:

forming a first insulating layer over the substrate, in which a portion of the first insulating layer within the trench is lower than the masking layer;

forming a second insulating layer over the substrate, in which the second insulating layer is at least about as hard as the masking layer or harder;

performing a chemical mechanical polishing (CMP) process to polish the first insulating layer and the second insulating layer, using the masking layer as a polishing stop, so that the masking layer is exposed, wherein a portion of the second insulating layer remains in the trench; and removing the masking layer and the pad oxide layer to form the STI structure on the substrate.

2. The method of claim 1, wherein before the step of forming the first insulating layer, the method further comprises forming a liner oxide layer over a side-wall of the trench in the substrate.

3. The method of claim 1, wherein the first insulating layer is softer than the masking layer.

4. The method of claim 1, wherein the step of forming the first insulating layer comprises using an atmospheric pressure chemical vapor deposition (APCVD) process to deposit oxide over the substrate.

5. The method of claim 1, wherein the step of forming the second insulating layer comprises using a high-density plasma chemical vapor deposition (HDPCVD) process to deposit oxide over the substrate.

6. A method for fabricating a shallow trench isolation (STI) structure on a semiconductor substrate, having a pad oxide layer and a masking layer sequentially formed over the substrate, and having a trench formed in the substrate through the pad oxide layer and the masking layer, the method comprising:

forming a chemical vapor deposition (CVD) insulating layer over the substrate, in which the CVD insulating layer is softer than the masking layer and a portion of the CVD insulating layer within the trench is lower than the masking layer;

forming a high-density plasma chemical vapor deposition (HDPCVD) insulating layer over the substrate;

performing a chemical mechanical polishing (CMP) process to polish the CVD insulating layer and the HDPCVD insulating layer, using the masking layer as a polishing stop, so that the masking layer is exposed, wherein a portion of HDPCVD insulating layer remains in the trench; and removing the masking layer and the pad oxide layer to form the STI structure on the substrate.

7. The method of claim 6, wherein the step of forming the CVD insulating layer comprises using an atmospheric pressure chemical vapor deposition (APCVD) process to deposit oxide over the substrate.

8. The method of claim 6, wherein the step of forming the HDPCVD insulating layer comprises using a HDPCVD process to deposit oxide over the substrate.

9. The method of claim 6, wherein the HDPCVD insulating layer is at least about as hard as the masking layer or harder.

10. The method of claim 6, wherein before the step of forming the CVD insulating layer, the method further comprises forming a liner oxide layer over a side-wall of the trench in the substrate.

* * * * *